United States Patent
Kadota et al.

[11] Patent Number: 6,127,769
[45] Date of Patent: Oct. 3, 2000

[54] SURFACE ACOUSTIC WAVE DEVICE

[75] Inventors: Michio Kadota; Hideya Horiuchi, both of Kyoto; Mamoru Ikeura, Nagaokakyo, all of Japan

[73] Assignee: Murata Manufacturing Co. Ltd, Japan

[21] Appl. No.: 09/103,322

[22] Filed: Jun. 23, 1998

[30] Foreign Application Priority Data

Jul. 7, 1997 [JP] Japan ................................ 9-181433

[51] Int. Cl.$^7$ .................................................. H01L 41/08
[52] U.S. Cl. ...................................... 310/313 B; 333/193
[58] Field of Search ........................... 310/313 R, 313 B, 310/313 BD; 333/193–196

[56] References Cited

U.S. PATENT DOCUMENTS

| | | | |
|---|---|---|---|
| 5,184,042 | 2/1993 | Kadota et al. | 310/313 A |
| 5,714,830 | 2/1998 | Kadota et al. | 310/313 B X |
| 5,767,603 | 6/1998 | Kadota et al. | 310/313 B |
| 5,793,147 | 8/1998 | Kadota et al. | 310/313 R |
| 5,802,685 | 9/1998 | Kadota et al. | 310/313 B X |
| 5,838,217 | 11/1998 | Kadota et al. | 310/313 B X |
| 5,914,554 | 6/1999 | Kadota et al. | 310/313 B |

FOREIGN PATENT DOCUMENTS

| | | |
|---|---|---|
| 0 541 284 | 5/1993 | European Pat. Off. . |
| 54-51759 | 4/1979 | Japan . |
| 5-183380 | 7/1993 | Japan . |
| 2 244 880 | 12/1991 | United Kingdom . |

OTHER PUBLICATIONS

IEEE Transactions on Microwave Theory and Techniques, vol. 44, No. 12, Dec. 1996 "A Bleustein—Gulyaev—Shimizu Wave Resonator Having Resonances for TV and VCR Tapes".

*Primary Examiner*—Mark O. Budd
*Attorney, Agent, or Firm*—Keating & Bennett LLP

[57] ABSTRACT

A surface acoustic wave device includes a surface acoustic wave substrate having first and second end surfaces, and a surface acoustic wave element provided on the surface acoustic wave substrate and operating using an SH-type surface acoustic wave. The surface acoustic wave element includes an interdigital transducer having a plurality of electrode fingers and a reflector having a plurality of electrode fingers. One of a pair of outermost electrode fingers is flush with one of the first and second end surfaces of the surface acoustic wave substrate, and the reflector is located at a side where the other of the pair of outermost electrode fingers is positioned, so that a SH-type surface acoustic wave excited by the IDT is confined between the reflector and the one of the first and second end surfaces.

20 Claims, 8 Drawing Sheets

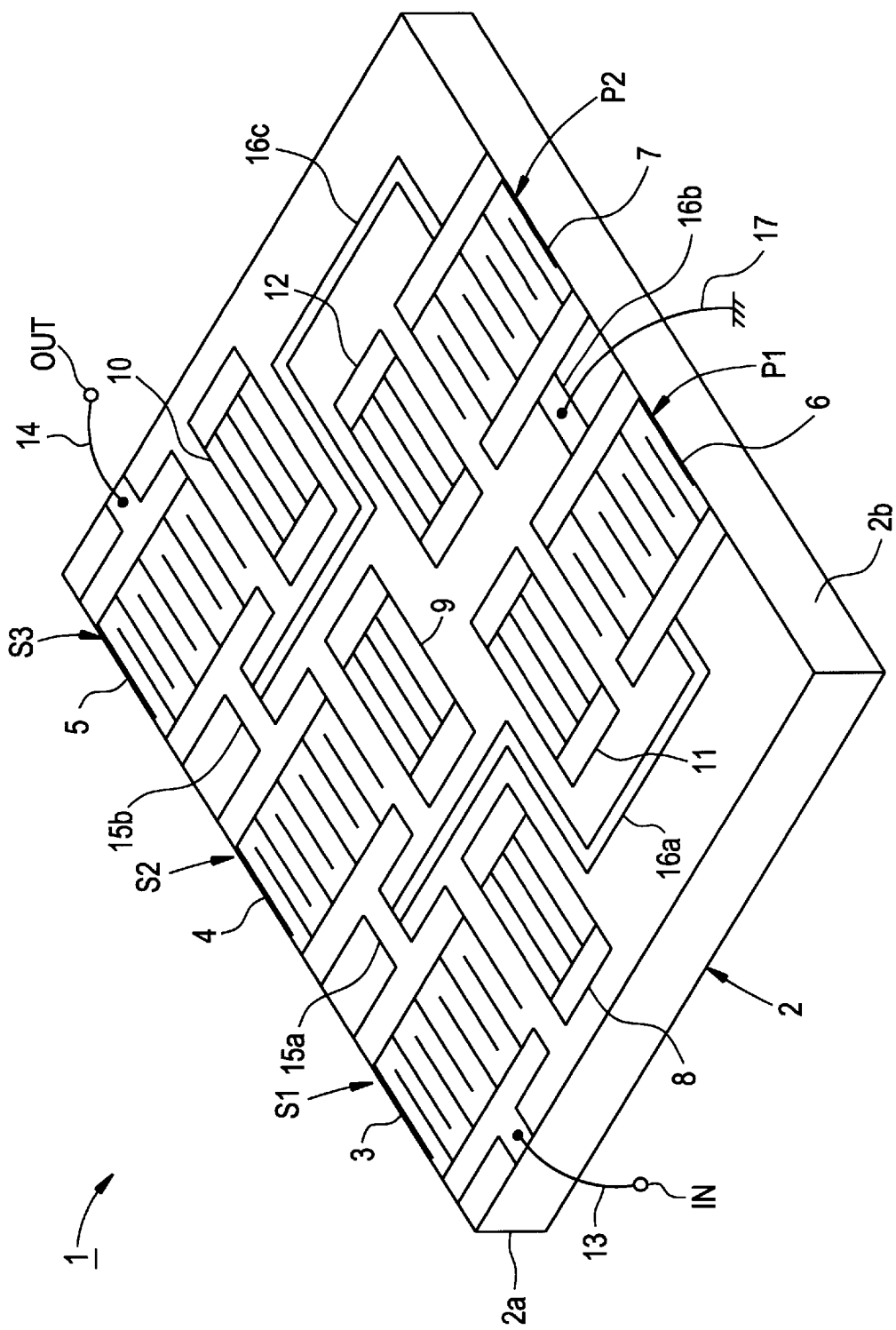

SURFACE ACOUSTIC WAVE DEVICE

BACKGROUND OF THE INVENTION

1. Field of the Invention

The present invention relates to a surface acoustic wave device using a shear horizontal type ("SH-type") surface acoustic wave and including a plurality of surface acoustic wave elements connected in such a manner to form, for example, a ladder-type filter.

2. Description of the Related Art

There are many conventional types of surface acoustic wave (SAW) devices which include a plurality of SAW elements. For example, a SAW filter in which a plurality of SAW resonators are arranged to define a ladder circuit is known and referred to as a ladder filter. FIG. 1A shows a conventional ladder filter 201 disclosed in Japanese Laid-open patent application No. 5-183380, and FIG. 1B is an equivalent circuit thereof. The ladder filter 201 includes a piezoelectric substrate 202 and series one-port SAW resonators 203 and 204 and parallel one-port SAW resonators 205, 206 and 207 disposed on the piezoelectric substrate 201. The series one-port SAW resonators 203 and 204 are connected in series between an input terminal IN and an output terminal OUT to define a series arm, and parallel one-port SAW resonators 205–207 are respectively connected in parallel between the series arm and a ground potential to each define a parallel arm.

As shown in FIG. 1A, the SAW resonators 203–207 each includes a respective pair of interdigital transducers (IDTs) 203a–207a and a respective pair of grating reflectors 203b–207b disposed on opposite sides thereof. In the SAW resonators 203–207, surface acoustic waves excited by the IDTs 203a–207a are confined between the grating reflectors 203b–207b so as to form standing waves. Each of the resonators 203–207 has a resonance characteristic in which the impedance of the resonator is low in the vicinity of a resonant frequency and the impedance is high in the vicinity of an antiresonant frequency.

In the ladder filter 201, the resonant frequency of series one-port resonators 203 and 204 are constructed to be coincident with the antiresonant frequency of the parallel one-port resonators 205–207. Thus, the ladder filter 201 is provided with a passband defined by the antiresonant frequency of the series one-port resonators 203 and 204 and the resonant frequency of the parallel one-port resonators 205–207.

The conventional ladder filter 201, and other ladder filters of this type have been widely applied to a televisions, VCRs, communication devices such as a cellular phone or the like. However, there has been a continuous demand for improving the performance of such a ladder filter and miniaturizing such a ladder filter.

SUMMARY OF THE INVENTION

The preferred embodiments of the present invention are constructed to overcome the deficiencies of the prior art devices and provide a surface acoustic wave device having significantly improved performance characteristics and a significantly reduced size as compared to conventional devices.

According to a preferred embodiment of the present invention, a surface acoustic wave device includes a surface acoustic wave substrate having a first end surface and a second end surface, and a surface acoustic wave element provided on the surface acoustic wave substrate and operating using a SH-type surface acoustic wave. The surface acoustic wave element includes an interdigital transducer having a plurality of electrode fingers and a reflector having a plurality of electrode fingers. One of a pair of outermost electrode fingers is flush with one of the first and second end surfaces of the surface acoustic wave substrate, and the reflector is located at a side where the other of the pair of outermost electrode fingers is positioned, so that a SH-type surface acoustic wave excited by the IDT is confined between the reflector and the one of the first and second end surfaces.

The surface acoustic wave device may include one or a plurality of the surface acoustic wave elements described above. If a plurality of surface acoustic wave elements are included the plurality of the surface acoustic wave elements are preferably connected in a ladder circuit or in a lattice circuit arrangement.

For the purpose of illustrating the preferred embodiments of the present invention, there is shown in the drawings several forms which are presently preferred, it being understood, however, that the invention is not limited to the precise arrangements and instrumentalities shown.

BRIEF DESCRIPTION OF THE DRAWINGS

FIG. 3A is a perspective view of a SAW device constituting a ladder circuit according to a first preferred embodiment of the present invention.

DETAILED DESCRIPTION OF PREFERRED EMBODIMENTS

The inventors of the present invention have studied edge reflection type SAW resonators as disclosed in U.S. Pat. No. 5,184,042 and IEEE Transactions on Microwave Theory and Technique, Vol. 44, No. 12, 1996, and have discovered that edge reflection type SAW resonators can be applied to a ladder filter or a SAW device including a plurality of SAW elements.

The present inventors discovered that the conventional ladder filter suffers from the problems associated with grating reflectors of SAW resonators. More specifically, the grating reflectors are relatively large compared to the size of IDTs, which prevents miniaturization of the ladder filter.

On the contrary, an edge reflection type SAW resonator requires no grating reflectors. Therefore, a ladder filter can be miniaturized by using an edge reflection type SAW filter. An edge-reflection type SAW resonator uses end surfaces of a piezoelectric substrate to reflect a surface acoustic wave, and the distance between the substrate end surfaces is set at a specific value which is determined by a frequency characteristic of the edge-reflection SAW resonator. This means only one edge-reflection SAW resonator can be formed on one substrate, and the size of the substrate differs based on the frequency characteristic of the edge-reflection SAW resonator. This requirement does not permit integrating a plurality of edge-reflection type SAW resonators. The inventors have solved this problem successfully as explained below in detail.

Hereinafter, preferred embodiments of the present invention are explained in detail with reference to the drawings.

Figure 1A:
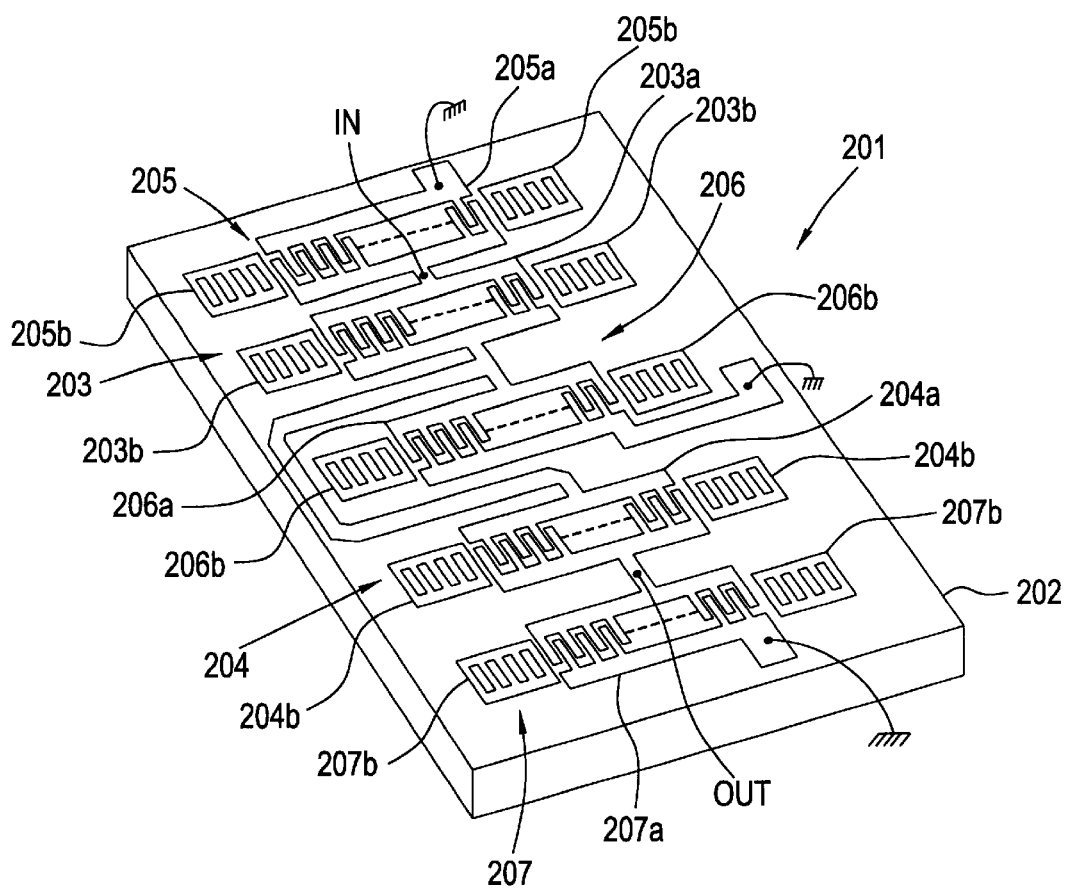
FIG. 1A is a perspective view showing a conventional ladder filter.
Figure 1B:
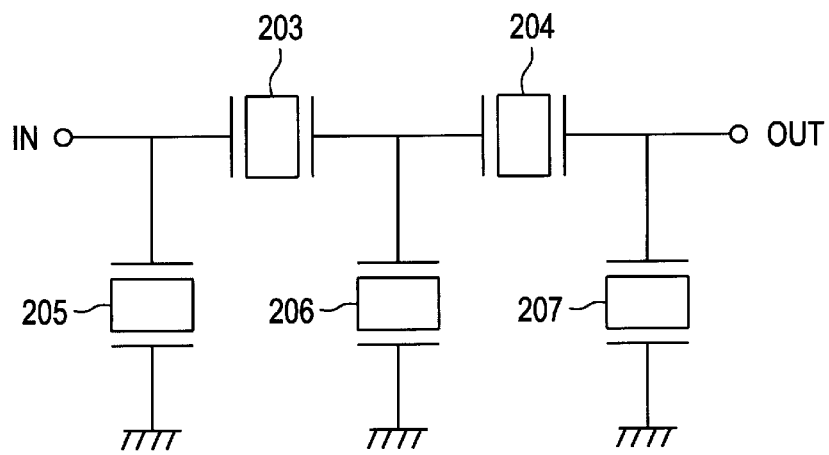
FIG. 1B is an equivalent circuit of the ladder filter shown in FIG. 1A.
Figure 2:
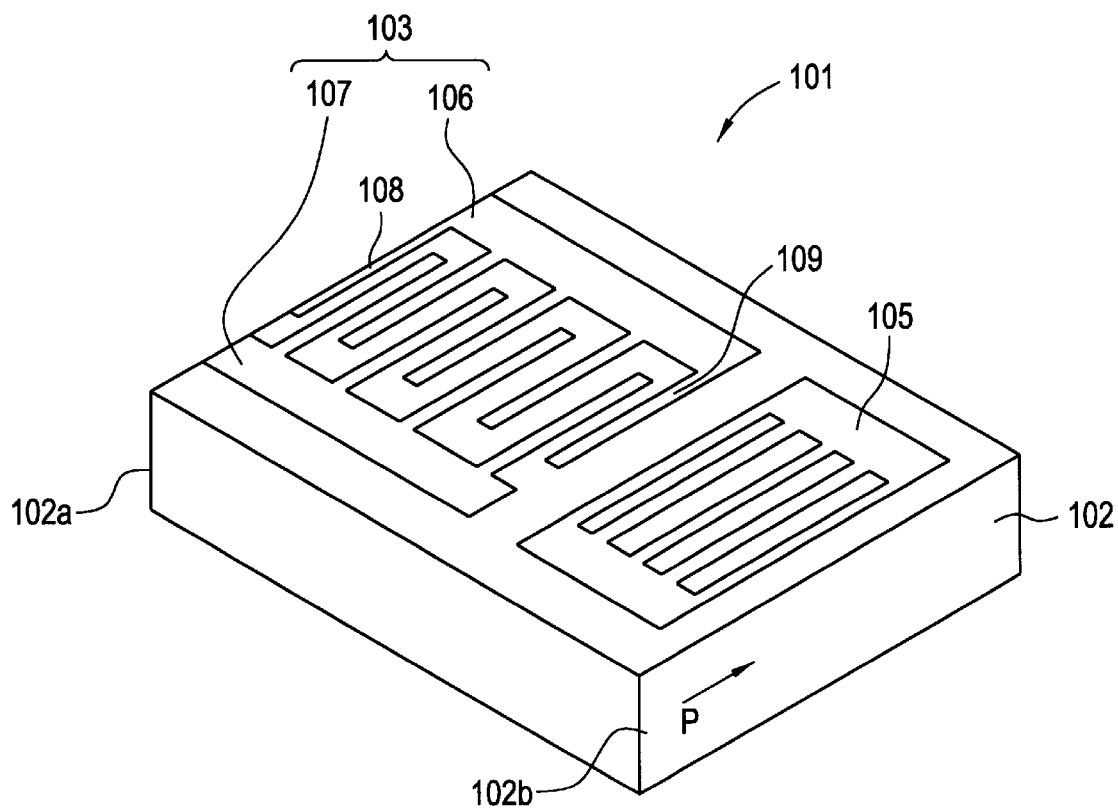
FIG. 2 is a perspective view of a SAW element used in a SAW device according to preferred embodiments of the present invention.

FIG. 2 is a perspective view illustrating an example of a surface acoustic wave (SAW) element 101 which is used as a one-port resonator in a SAW device according to preferred embodiments of the present invention. The SAW element 101 is constructed to utilize a shear horizontal (SH) surface wave. In this specification, an SH surface acoustic wave is defined as a surface acoustic wave which experiences displacement in a direction that is substantially perpendicular to the propagating direction of the surface acoustic wave and is substantially parallel to the surface of a substrate on which the SH surface acoustic wave is excited. For example, such SH surface waves include SH leaky waves, Love waves and BGS (Bleustein-Gulyaev-Shimizu) waves.

The SAW element 101 includes a piezoelectric substrate 102, an interdigital transducer (IDT) 103 and a reflector 105. The piezoelectric substrate 102 has a pair of end surfaces 102a and 102b and is preferably made of a piezoelectric material such as a lead titanate zirconate piezoelectric ceramic, a LiNbO$_3$ piezoelectric single crystal, a LiTaO$_3$ piezoelectric single crystal, or quartz single crystal. In the case where the substrate 102 is made of piezoelectric ceramics, the substrate 2 is preferably polarized in the direction indicated by the arrow P shown in FIG. 2.

The IDT 103 has a pair of comb-shaped electrodes 106 and 107 disposed on the upper surface of the substrate 102 and the comb-shaped electrodes 106 and 107 are arranged to be interdigitated with each other. Each of the comb-shaped electrodes 106 and 107 include a plurality of electrode fingers, whereby the IDT has a pair of outermost electrode fingers 108 and 109. One of the pair of outermost electrode fingers, i.e., the outermost electrode finger 108 is arranged to be flush with one of the end surfaces, i.e., for example, the end surface 102a.

The reflector 105 is preferably a grating reflector and includes a plurality of electrode fingers. Both ends of the electrode fingers are short-circuited. The reflector 105 is located on the side of the other of the pair of outermost electrode fingers, i.e., the outermost electrode finger 109.

The space between the electrode fingers and the width of the electrode fingers except the outermost electrode fingers 108 are preferably set at about $\lambda/4$, where $\lambda$ is a wavelength of the SH type wave to be excited on the substrate 2. The width of the outermost electrode finger 108 is preferably set at about $\lambda/8$.

Upon application of an alternating current voltage from the comb-shaped electrodes 106 and 107, the SH wave is excited in the SAW element 101 and propagates in the direction which is substantially perpendicular to the end surface 102a. The SH wave is reflected between the end surface 102a and the reflector 105 so that the SH wave is confined therebetween.

Since the SAW element 101 requires only one reflector, the SAW element 101 can be made smaller than a SAW element having a pair of reflectors. In addition, the end surface of the substrate 102 of the SAW element 101 does not have to be aligned with the outermost electrode finger on the side where the reflector is provided. This permits the substrate 2 to extend beyond the reflector 105 and provide a space to form other SAW elements, electrodes to be connected between the SAW element 101 and the other SAW elements or the like thereon. Therefore, it is possible that a plurality of SAW elements 101 are formed and arranged on a single substrate to form a parallel and/or series circuit, thereby increasing the flexibility of arranging the plurality of SAW elements 101 on a single substrate.

Hereinafter, a surface acoustic wave device comprising a plurality of SAW elements shown in FIG. 2 will be explained in detail.

FIG. 3A is a perspective view illustrating a surface acoustic wave device according to a first preferred embodiment of the present invention.

In the surface acoustic wave device 1 shown in FIG. 3A, a plurality of surface acoustic wave elements, which operate using a BGS wave as the SH-type surface acoustic wave, are connected to form a ladder-type filter.

The surface acoustic wave device 1 includes a substantially rectangular-shaped surface acoustic wave substrate 2. The surface acoustic wave substrate 2 is preferably made of a piezoelectric single crystal or piezoelectric ceramic such as LiTaO$_3$, or quartz. IDTs 3–5 are provided on the upper surface of the surface acoustic wave substrate 2 such that the IDTs 3–5 are located along an end surface 2a of the surface acoustic wave substrate 2. Furthermore, IDTs 6 and 7 are provided on the upper surface of the surface acoustic wave substrate 2 such that the IDTs 6 and 7 are located along an end surface 2b of the surface acoustic wave substrate 2.

Each IDT 3–5 has comb-shaped electrodes having a plurality of electrode fingers wherein one of a pair of outermost fingers is flush with the end surface 2a. Reflectors 8–10 are formed at sides, opposite to the end surface 2a in the propagation direction of the surface acoustic wave, of the respective IDTs 3–5, i.e., at sides where the other of the pair of outermost fingers of each IDT 3 to 5 is located. Each reflector 8–10 is preferably a grating reflector having a plurality of electrode fingers short-circuited at both ends.

The IDT 3 and the reflector 8 form a series arm resonator S1 which corresponds to a SAW element 101 shown in FIG. 2. In this series arm resonator S1, a surface acoustic wave is generated by the IDT 3 and reflected by the end surface 2a and the reflector 8 and thus, the surface acoustic wave is confined between the end surface 2a and the reflector 8. In contrast to the edge reflection type surface acoustic wave resonator in which the surface acoustic wave is confined between both end surfaces, the surface acoustic wave in the series arm resonator S1 is reflected by the end surface 2a that is located at one side end of the IDT 3 and also by the reflector 8 located at the opposite side of the IDT 3 so that the surface acoustic wave is confined between the end surface 2a and the reflector 8.

Similarly, the IDT 4 and the reflector 9 form a series arm resonator S2, and the IDT 5 and the reflector 10 form a series arm resonator S3.

Each IDT 6 and 7 has comb-shaped electrodes having a plurality of electrode fingers wherein one of a pair of outermost fingers is flush with the end surface 2b. Reflectors 11 and 12 are formed at sides, opposite to the end surface 2b in the propagation direction of the surface acoustic wave, of the respective IDTs 6 and 7, i.e., at sides where the other of the pair of outermost fingers of each IDT 6 and 7 is located. Each reflector 11 and 12 is preferably a grating reflector having a plurality of electrode fingers short-circuited at both ends.

The IDT 6 and the reflector 11 form a parallel arm resonator P1, and the surface acoustic wave generated by the IDT 6 is confined between the reflector 11 and the end surface 2b. In the same way, the IDT 7 and the reflector 12 form a parallel arm resonator P2, and the surface acoustic wave generated by the IDT 7 is confined between the reflector 12 and the end surface 2b.

The series arm resonator S1 is connected to the input terminal IN preferably via a bonding wire 13. The series arm resonator S3 is connected to the output terminal OUT preferably via a bonding wire 14. Furthermore, the series arm resonator S1 and the series arm resonator S2 are electrically connected to each other via a connection electrode 15a disposed on the substrate 2. Similarly, the series arm resonator S2 and the series arm resonator S3 are electrically connected to each other via a connection electrode 15b on the substrate 2.

Furthermore, there is provide a connection electrode 16a, one end of which is connected to the connection electrode 15a and the other end of which is connected to the parallel arm resonator P1. The parallel arm resonator P1 and the parallel arm resonator P2 are connected to each other via a connection electrode 16b. The connection electrode 16b is connected to one end of a bonding wire 17. The other end of the bonding wire 17 is grounded. The connection electrode 16a and 16b are formed on the substrate 2.

The parallel arm resonator P2 is connected to the connection electrode 15b via a connection electrode 16c formed on the substrate 2.

Figure 3B:
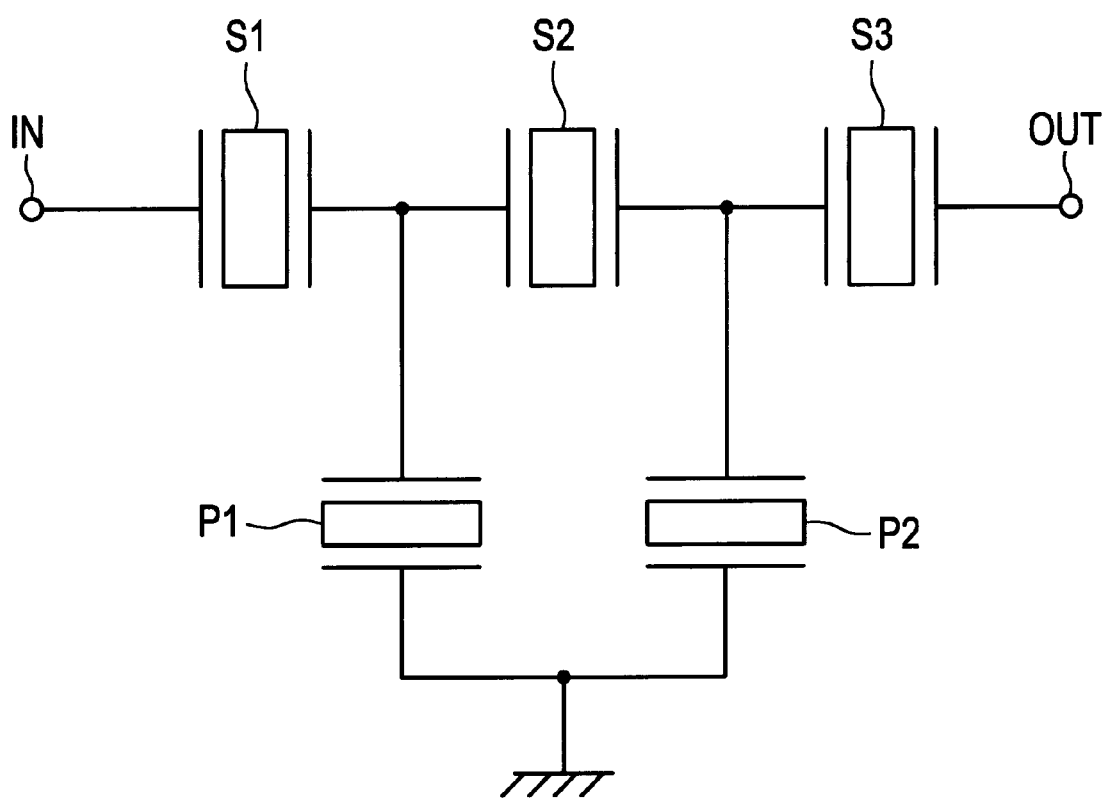
FIG. 3B is an equivalent circuit of the SAW device shown in FIG. 3A.

Thus, the series arm resonators S1 to S3 and the parallel arm resonators P1 and P2 are connected so that a ladder circuit is formed as shown in FIG. 3B. That is, a ladder-type filter is realized by arranging the IDTs 3–7, the reflectors 8–12, and the connection electrodes 15a, 15b, and 16a–16c on the single surface acoustic wave substrate 2.

The IDTs 3–7, the reflectors 8–12, and the connection electrodes 15a, 15b, and 16a–16c are formed of an electrically conductive material, for example, metal such as aluminum, silver, or copper or an alloy. The formation of these elements may be performed by means of evaporation, plating, sputtering, coating and curing of a conductive paste, or other suitable techniques.

According to the SAW device 1, since each of the resonators S1 to S3, P1 and P2 has only one reflector, the total area of the SAW device 1 can be greatly reduced compared to a SAW device in which each of the resonators comprises a conventional SAW element having a pair of reflectors.

In addition, the end surface serving to reflect the surface acoustic wave can be obtained simply by producing exposed end surfaces 2a and 2b by means of dicing. That is, it is only necessary to perform the high-precision process of forming end surfaces by means of dicing twice thereby greatly simplifying the manufacturing process.

Furthermore, connections among the surface acoustic wave resonators S1–S3 and P1, P2 are all realized by electrically conductive patterns, that is, the connection electrodes 15a, 15b, 16a–16c, provided on the surface acoustic wave substrate 2. That is, in the present preferred embodiment, the connections among the surface acoustic wave resonators can be made without using bonding wires and thus, a reduction in the number of bonding wires is achieved, and the process of making connections with bonding wires is greatly simplified. More specifically, in the surface acoustic wave device 1, bonding wires 13, 14, and 17 are used only to connect the surface acoustic wave device 1 to the input terminal, the output terminal, and the ground and no bonding wires are required to make connections inside the ladder network.

Figure 4A:
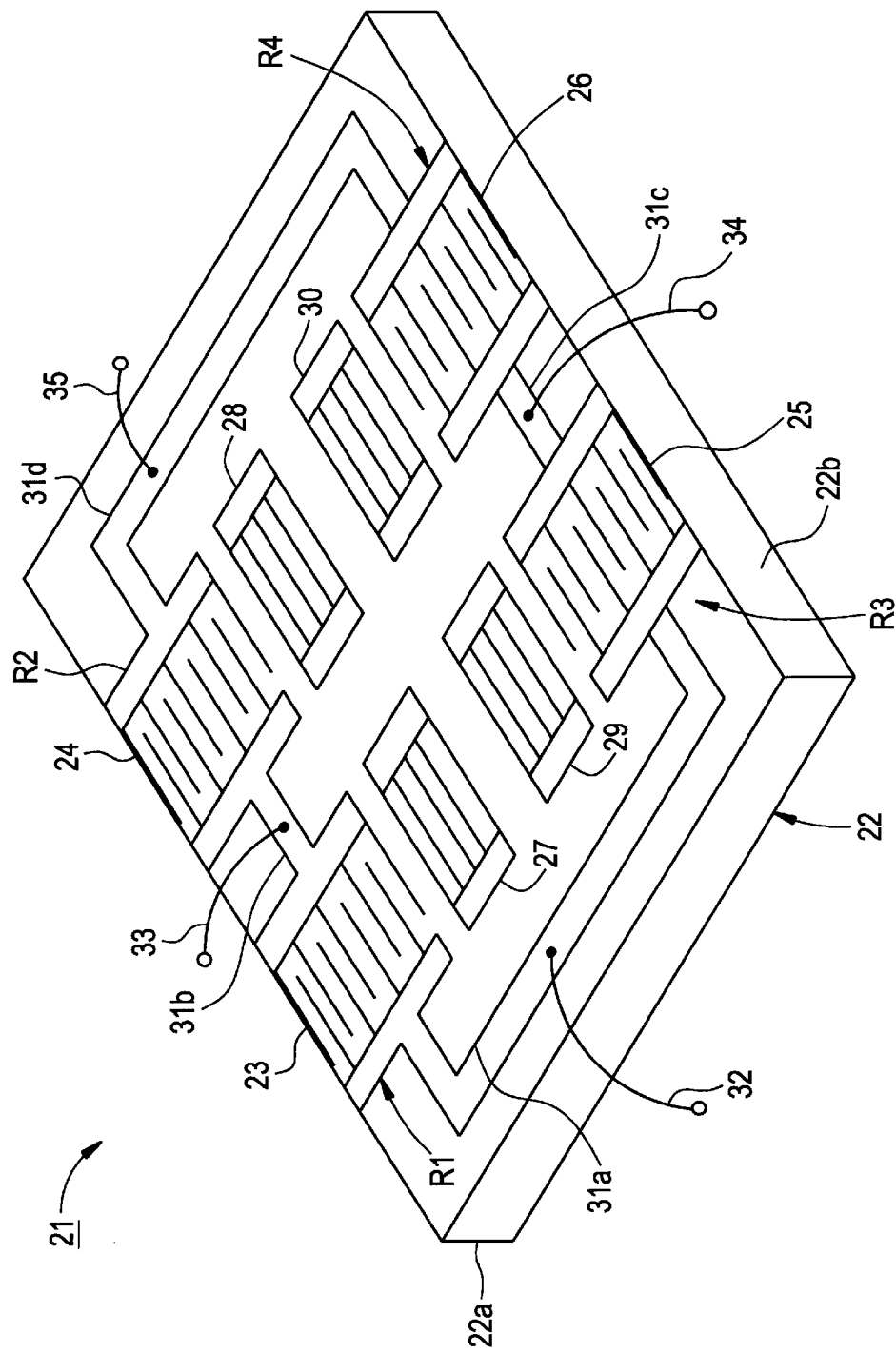
FIG. 4A is a perspective view of a SAW device constituting a lattice circuit according to second preferred embodiment of the present invention.
Figure 4B:
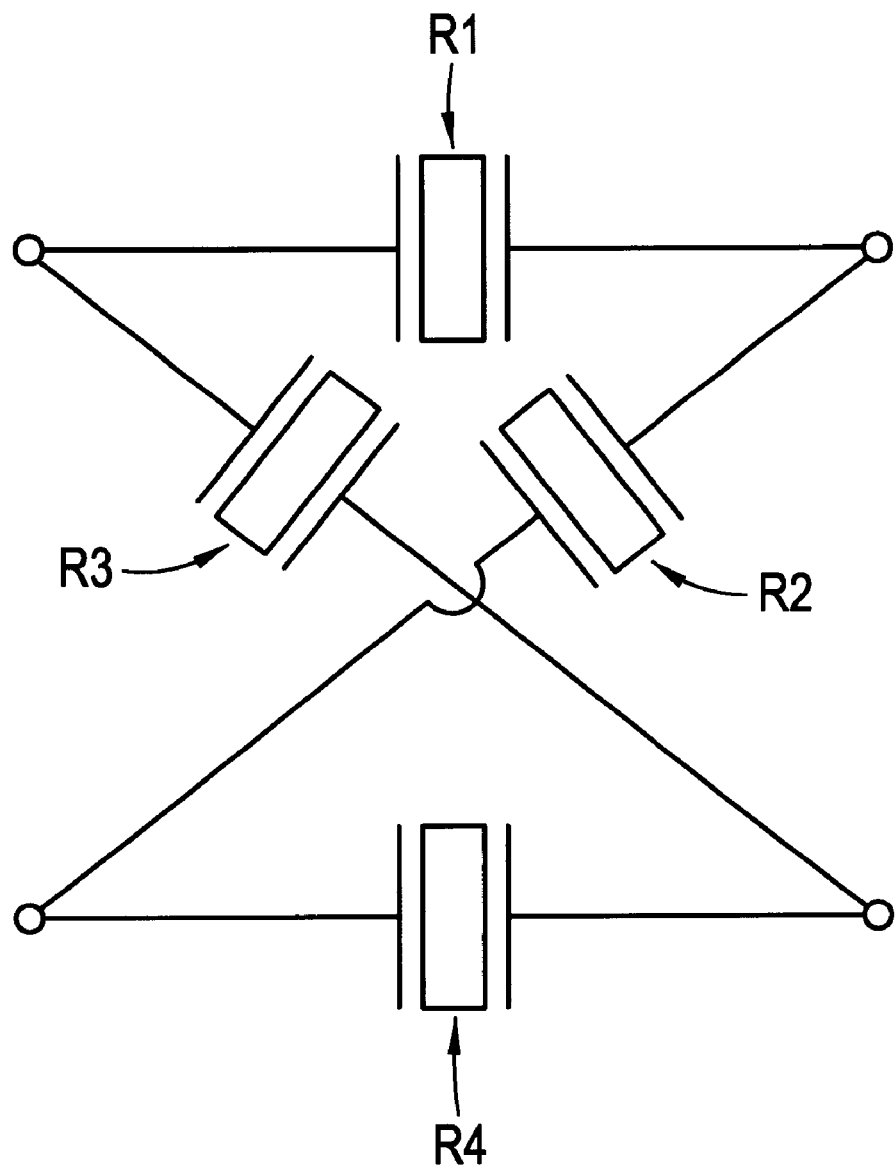
FIG. 4B is an equivalent circuit of the SAW device shown in FIG. 3A.
Figure 5:
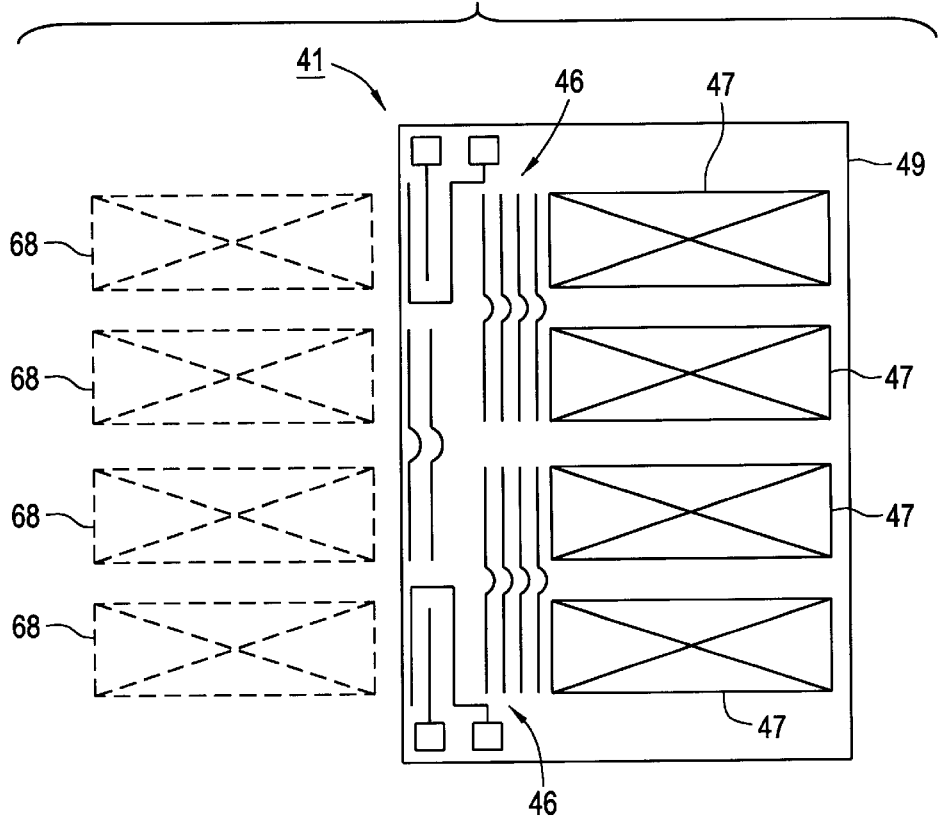
FIG. 5 is a schematic plan view showing a SAW device according to another preferred embodiment of the present invention.
Figure 6:
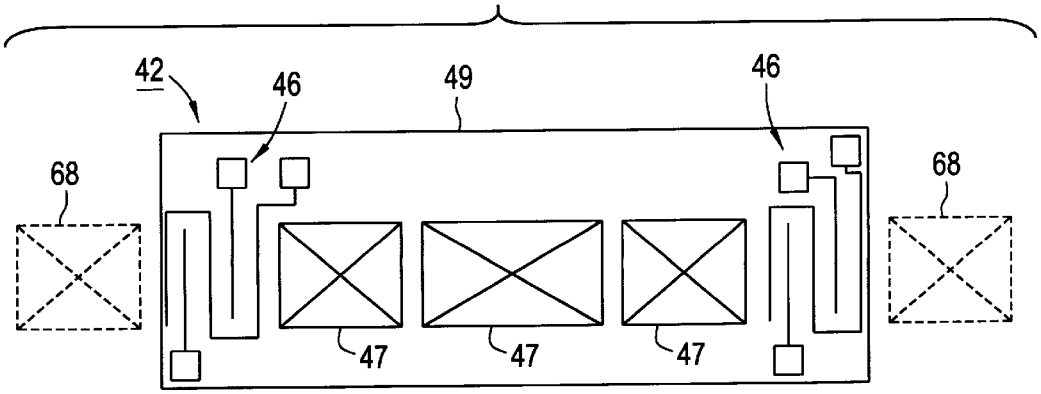
FIG. 6 is a schematic plan view showing a SAW device according to still another preferred embodiment of the present invention.
Figure 7:
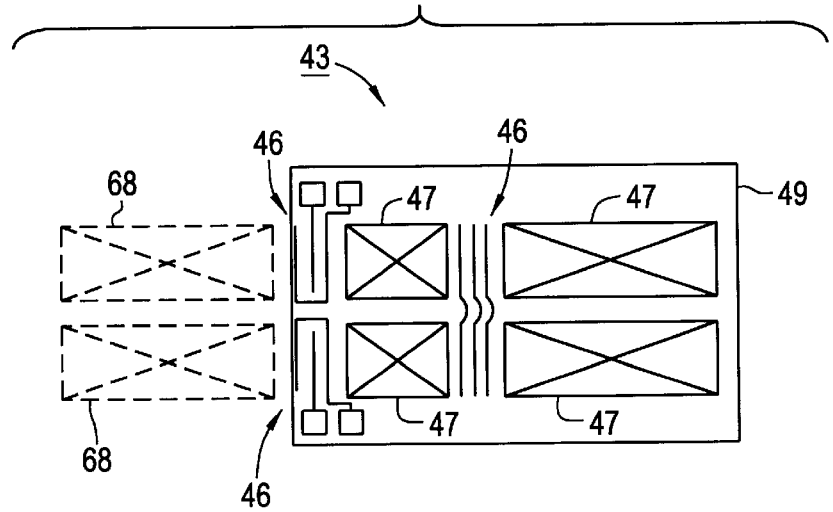
FIG. 7 is a schematic plan view showing a SAW device according to another preferred embodiment of the present invention.
Figure 8:
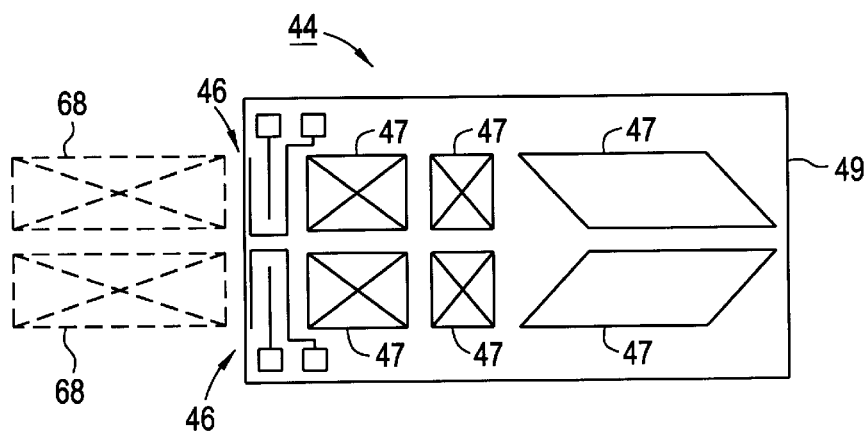
FIG. 8 is a schematic plan view showing a SAW device according to another preferred embodiment of the present invention.
Figure 9:
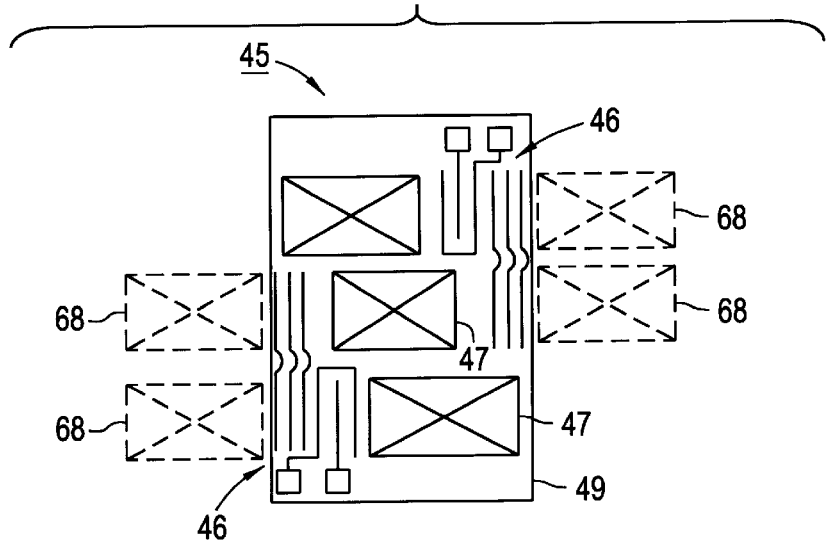
FIG. 9 is a schematic plan view showing a SAW device according to another preferred embodiment of the present invention.

FIG. 4A is a perspective view illustrating a second preferred embodiment of a SAW device according to the present invention, and FIG. 4B shows an equivalent circuit of the SAW device shown in FIG. 4A. In the present preferred embodiment, the SAW device 21 preferably includes four surface acoustic wave resonators connected in such a manner as to serve as a lattice-type filter which operates using a BGS wave.

The surface acoustic wave device 21 preferably includes a surface acoustic wave substrate 22. The surface acoustic wave substrate 22 may be made of a material similar to that used in the first preferred embodiment to form the surface acoustic wave substrate. IDTs 23 and 24 are located on one side, along a side surface 22a, of the surface acoustic wave substrate 22. IDTs 25 and 26 are located on the opposite side, along a side surface 22b, of the surface acoustic wave substrate 22.

Each IDT 23–26 has comb-shaped electrodes including a plurality of interdigital electrode fingers wherein one of a pair of outermost electrode fingers is flush with either the end surface 22a or the end surface 22b.

Reflectors 27 and 28 are provided at sides of the IDTs 23 and 24, respectively, wherein those sides are opposite, in the propagation direction of surface acoustic waves, to the end surface 22a. The surface acoustic wave generated by the IDT 23 is reflected by the end surface 22a and the reflector 27 and thus, the surface acoustic wave is confined therebetween. Therefore, a surface acoustic wave resonator is provided which is similar to the surface acoustic wave resonator S1 in the first preferred embodiment. That is, the IDT 23 and the reflector 27 define one surface acoustic wave resonator R1. Similarly, the IDT 24 and the reflector 28 define another surface acoustic wave resonator R2.

On the other hand, on the side where the IDTs 25 and 26 are disposed, reflectors 29 and 30 are located at sides of the IDTs 25 and 26, respectively, wherein those sides are opposite to the end surface 22b in the propagation direction of surface acoustic waves. That is, the IDT 25 and the reflector 29 define a surface acoustic wave resonator R3, and the IDT 26 and the reflector 30 define a surface acoustic wave resonator R4. In the surface acoustic wave resonators R3 and R4, surface acoustic waves are reflected by the end surface 22b and the reflector 20 or 30, and thus, the surface acoustic waves are confined between the end surface 22b and the reflector 29 or 30.

The surface acoustic wave resonator R1 and the surface acoustic wave resonator R3 are electrically connected to each other via an electrically conductive pattern of connection electrode 31a disposed on the surface acoustic wave substrate 22. A bonding wire 32 is connected to the connection electrode 31a.

The surface acoustic wave resonator R1 and the surface acoustic wave resonator R2 are electrically connected to each other via a connection electrode 31b. The surface acoustic wave resonator R3 and the surface acoustic wave resonator R4 are electrically connected to each other via a connection electrode 31c. Bonding wires 33 and 34 are connected to the connection electrodes 31b and 31c, respectively. Furthermore, the surface acoustic wave resonator R2 and the surface acoustic wave resonator R4 are connected to each other via a connection electrode 31d. A bonding wire 35 is connected to the connection electrode 31d.

Thus, in the surface acoustic wave device 21, a lattice-type filter is formed by the surface acoustic wave resonators R1–R3 being connected in the form of a lattice network, as shown in the circuit diagram of FIG. 4B, between the nodes connected to the bonding wires 32–35.

Also in the preferred embodiment, since each of resonators R1–R4 has only one reflector, the total area of the SAW device 21 is significantly reduced compared to a SAW device in which each of resonators comprises a conventional SAW element having a pair of reflectors.

In addition, dicing for producing the reflecting end surfaces of the surface acoustic wave substrate is required only for producing the end surface surfaces 22a and 22b. That is, the surface acoustic wave substrate 22 can be obtained by performing dicing only twice.

Furthermore, the connections among the surface acoustic wave resonators R1–R4 to form the lattice-type filter are realized by arranging the electrically conductive pattern of connection electrodes 31a–31d on the surface acoustic wave substrate 22. In other words, the electric connections among the resonators can be made without having to use a bonding wire. Thus, the number of bonding wires is reduced, and the reduced number of bonding wires can be connected by simple processing.

In the first and second preferred embodiments described above, the surface acoustic wave device is arranged to define a ladder-type filter or a lattice-type filter. However, the surface acoustic wave device of the present invention is not limited to such circuit forms. That is, in the surface acoustic wave device of the present invention, a plurality of surface acoustic wave resonators may be connected in any manner so as to form a desired circuit. FIGS. 5 to 9 illustrate some examples of SAW resonator filters 41, 42, 43, 44, and 45 according to other preferred embodiments of the present invention. In FIGS. 5 to 9, IDTs are denoted by reference numeral 46 and reflectors are denoted by reference numeral 47. Substrates are denoted by reference numeral 49. It is noted that FIGS. 5 to 9 also show reflectors 68, by dotted lines, which are required in conventional SAW resonator filters corresponding to the SAW resonator filters 41, 42, 43, 44, and 45, but are unnecessary in the SAW resonator filters 41, 42, 43, 44, and 45.

In the SAW resonator filters 41 to 45, the reflectors 68 which are to be provided in the conventional filters are replaced by end surfaces of the substrate 49, respectively, and one of a pair of outermost electrode fingers of IDTs 46 is flush with the end surface. Therefore, the SAW resonator filters 41–45 are significantly smaller than the conventional corresponding SAW resonator filters by about one fourth to a half the area.

As described above, the preferred embodiments of the present invention may be used to realize various types of surface acoustic wave devices in which a plurality of surface acoustic wave elements which operate using a SH-type surface acoustic wave are properly connected.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a surface acoustic wave substrate having a first end surface and a second end surface;
   a surface acoustic wave element provided on the surface acoustic wave substrate and operating using a shear horizontal-type surface acoustic wave, the surface acoustic wave element including an interdigital transducer having a plurality of electrode fingers and a reflector having a plurality of electrode fingers, one of a pair of outermost electrode fingers being flush with one of the first and second end surfaces of the surface acoustic wave substrate, the reflector being located at a side where the other of the pair of outermost electrode fingers is positioned so that a shear horizontal-type surface acoustic wave excited by the IDT is confined between the reflector and the one of the first and second end surfaces.

2. A surface acoustic wave device according to claim 1, further comprising a plurality of surface acoustic wave elements each including an interdigital transducer having a plurality of electrode fingers and a reflector having a plurality of electrode fingers, one of a pair of outermost electrode fingers being flush with one of the first and second end surfaces of the surface acoustic wave substrate, the reflector being located at a side where the other of the pair of outermost electrode fingers is positioned so that a shear horizontal-type surface acoustic wave excited by the IDT is confined between the reflector and the one of the first and second end surfaces.

3. A surface acoustic wave device according to claim 2, wherein the plurality of the surface acoustic wave elements are connected in a ladder circuit.

4. A surface acoustic wave device according to claim 3, wherein a first group of the plurality of the surface acoustic wave elements constitute parallel resonators of the ladder circuit and are arranged so that one of the pair of the outermost electrode fingers is flush with the first end surface of the surface acoustic wave substrate, and a second group of the plurality of the surface acoustic wave elements constitute series resonators of the ladder circuit and are arranged so that one of the pair of the outermost electrode fingers is flush with the second end surface of the surface acoustic wave substrate.

5. A surface acoustic wave device according to claim 4, further comprising a plurality of connecting electrodes provided on the surface acoustic wave substrate, wherein the first group and the second group of the surface acoustic wave elements are electrically connected by the plurality of connecting electrodes.

6. A surface acoustic wave device according to claim 2, wherein the plurality of the surface acoustic wave elements are connected in a lattice circuit.

7. A surface acoustic wave device according to claim 6, wherein a first group of the plurality of the surface acoustic wave elements are arranged so that one of the pair of the outermost electrode fingers is flush with the first end surface of the surface acoustic wave substrate, and a second group of the plurality of the surface acoustic wave elements are arranged so that one of the pair of the outermost electrode fingers is flush with the second end surface of the surface acoustic wave substrate.

8. A surface acoustic wave device according to claim 7, further comprising a plurality of connecting electrodes provided on the surface acoustic wave substrate, wherein the first group and the second group of the surface acoustic wave elements are electrically connected by the plurality of connecting electrodes.

9. A surface acoustic wave device according to claim 1, wherein the reflector is a grating reflector.

10. A surface acoustic wave device comprising:
- a surface acoustic wave substrate having a first end surface and a second end surface;
- at least one surface acoustic wave element provided on the surface acoustic wave substrate and operating using a shear horizontal-type surface acoustic wave, the at least one surface acoustic wave element including an interdigital transducer having a plurality of electrode fingers and only a single reflector having a plurality of electrode fingers.

11. A surface acoustic wave device according to claim 10, wherein the at least one surface acoustic wave element is arranged on the surface acoustic wave substrate such that a first end of the interdigital transducer is flush with the first end surface of the surface acoustic wave substrate and a second end of the interdigital transducer is located near the second end surface with the single reflector being located between the second end of the interdigital transducer and the second end surface of the surface acoustic wave substrate.

12. A surface acoustic wave device according to claim 10, wherein one of a pair of outermost electrode fingers being flush with one of the first and second end surfaces of the surface acoustic wave substrate and the single reflector is located at a side where the other of the pair of outermost electrode fingers is positioned so that a shear horizontal-type surface acoustic wave excited by the IDT is confined between the single reflector and the one of the first and second end surfaces.

13. A surface acoustic wave device according to claim 10, further comprising a plurality of surface acoustic wave elements each including an interdigital transducer having a plurality of electrode fingers and only a single reflector having a plurality of electrode fingers.

14. A surface acoustic wave device according to claim 13, wherein the plurality of the surface acoustic wave elements are connected in a ladder circuit.

15. A surface acoustic wave device according to claim 14, wherein a first group of the plurality of the surface acoustic wave elements constitute parallel resonators of the ladder circuit and are arranged so that one of the pair of the outermost electrode fingers is flush with the first end surface of the surface acoustic wave substrate, and a second group of the plurality of the surface acoustic wave elements constitute series resonators of the ladder circuit and are arranged so that one of the pair of the outermost electrode fingers is flush with the second end surface of the surface acoustic wave substrate.

16. A surface acoustic wave device according to claim 15, further comprising a plurality of connecting electrodes provided on the surface acoustic wave substrate, wherein the first group and the second group of the surface acoustic wave elements are electrically connected by the plurality of connecting electrodes.

17. A surface acoustic wave device according to claim 13, wherein the plurality of the surface acoustic wave elements are connected in a lattice circuit.

18. A surface acoustic wave device according to claim 17, wherein a first group of the plurality of the surface acoustic wave elements are arranged so that one of the pair of the outermost electrode fingers is flush with the first end surface of the surface acoustic wave substrate, and a second group of the plurality of the surface acoustic wave elements are arranged so that one of the pair of the outermost electrode fingers is flush with the second end surface of the surface acoustic wave substrate.

19. A surface acoustic wave device according to claim 17, further comprising a plurality of connecting electrodes provided on the surface acoustic wave substrate, wherein the first group and the second group of the surface acoustic wave elements are electrically connected by the plurality of connecting electrodes.

20. A surface acoustic wave device according to claim 10, wherein the single reflector is a grating reflector.

* * * * *